United States Patent
Tsu et al.

(10) Patent No.: US 6,461,955 B1
(45) Date of Patent: Oct. 8, 2002

(54) YIELD IMPROVEMENT OF DUAL DAMASCENE FABRICATION THROUGH OXIDE FILLING

(75) Inventors: Robert Tsu, Plano; Qi-Zhong Hong, Dallas; William R. Mckee, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/521,325

(22) Filed: Mar. 9, 2000

Related U.S. Application Data

(60) Provisional application No. 60/131,642, filed on Apr. 29, 1999.

(51) Int. Cl.⁷ .......................................... H01L 21/4763
(52) U.S. Cl. ...................... 438/618; 438/622; 438/637; 438/694; 438/738; 438/745
(58) Field of Search ................. 438/618, 620, 438/622, 624, 634, 636, 637, 638, 687, 690, 694, 699, 706, 738, 745, 746

(56) References Cited

U.S. PATENT DOCUMENTS

| | | | |
|---|---|---|---|
| 5,294,294 | * 3/1994 | Namose | 438/699 |
| 5,736,457 | * 4/1998 | Zhao | 438/624 |
| 5,970,374 | * 10/1999 | Teo | 438/629 |
| 6,054,380 | * 8/2000 | Naik | 438/624 |
| 6,103,456 | * 8/2000 | Tobben et al. | 430/317 |
| 6,103,601 | * 8/2000 | Lee et al. | 438/513 |
| 6,153,514 | * 11/2000 | Wang et al. | 438/640 |
| 6,197,696 | * 3/2001 | Aoi | 438/700 |
| 6,204,166 | * 3/2001 | McTeer | 438/624 |
| 6,235,628 | * 5/2001 | Wang et al. | 438/638 |

* cited by examiner

*Primary Examiner*—Michael Sherry
*Assistant Examiner*—Asok Kumar Sarkar
(74) *Attorney, Agent, or Firm*—Jacqueline J. Garner; W. James Brady, III; Frederick J. Telecky, Jr.

(57) ABSTRACT

A dual damascene process. After the via etch, a via protect layer (114) is deposited in the via (112). The via protect layer (114) comprises a material that has a dry etch rate at least equal to that of the IMD (108) and a wet etch rate that is approximately 100 times that of the IMD (108) or greater. Exemplary materials include PSG, BPSG, and HSQ. The trench pattern (120) is formed and both the via protect layer (114) and IMD (108) are etched. The remaining portions of the via protect layer (114) are then removed prior to forming the metal layer (122).

17 Claims, 3 Drawing Sheets

YIELD IMPROVEMENT OF DUAL DAMASCENE FABRICATION THROUGH OXIDE FILLING

This application claims priority under 35 USC § 119(e)(1) of provisional application Ser. No. 60/131,642 filed Apr. 29, 1999.

FIELD OF THE INVENTION

The invention is generally related to the field of forming interconnect layers in integrated circuits and more specifically to dual damascene interconnect processes.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any barrier metals) are deposited, patterned, and etched to form the interconnect lines. Then, an interlevel dielectric (ILD) is deposited and planarized. In a damascene process, the ILD is formed first. The ILD is then oatterned and etched. The metal is then deposited over the structure and then chemically-mechanically polished to remove the metal from over the ILD, leaving metal interconnect lines. A metal etch is thereby avoided.

One prior art damascene process, a dual damascene process, is described with reference to FIGS. 1A–E. Referring to FIG. 1A, a silicon nitride layer 12 is deposited over a semiconductor body 10. Semiconductor body 10 will have been processed through a first metal interconnect layer. A via level dielectric 14 is deposited over silicon nitride layer 12. Via dielectric layer 14 comprises FSG (fluorine-doped silicate glass). Another silicon nitride layer 18 is deposited over via level dielectric 14 and a second, trench level dielectric 20 is deposited over silicon nitride layer 18. A via 22 is then patterned and etched through the trench level dielectric 20, silicon nitride layer 18 and via level dielectric 14. Silicon nitride layer 12 is used as an etch stop.

Referring to FIG. 1B, a spin-on photoresist 24 is deposited to fill a portion of via 22 with photoresist. The result is approximately 600 Å of resist over dielectric 20 and a thickness of ~2000–2500 Å within the via 22. Photoresist 24 protects via 22 during the subsequent trench etch. Next, the trench,pattern 26 is formed on the. structure as shown in FIG. 1C. Trench pattern 26 exposes areas of trench level dielectric 20 where the metal interconnect lines are desired.

Referring to FIG. 1D, the trench etch to remove portions of FSG layer 20 is performed. Unfortunately, oxide pillars 28 remain due to the slope of via 22. The remaining portions of photoresist 24 are also removed, as shown in FIG. 1E. Even after cleanup processing, defects (polymers, etc.) are left in the via 22. The oxide pillars 28 and defects create problems during subsequent processing. For example, after silicon nitride layer 12 is etched, a barrier metal is typically deposited. It is difficult to ensure that the barrier metal covers oxide pillars 28. This decreases the process margin. Accordingly, there is a need for a dual damascene process that avoids or minimizes oxide pillars.

SUMMARY OF THE INVENTION

A dual damascene process is disclosed herein. After the via etch, a via protect layer is deposited in the via. The via protect layer comprises a material that has a dry etch rate at least equal to that of the intrametal dielectric (IMD) and a wet etch rate that is approximately 100 times that of the IMD or greater. Exemplary materials include PSG, BPSG, and HSQ. The trench pattern is formed and both the via protect layer and IMD are etched. The remaining portions of the via protect layer are then removed prior to forming the metal layer.

An advantage of the invention is providing a dual damascene process that avoids or minimizes the formation of oxide pillars.

This and other advantages will be apparent to those of ordinary skill in the art having reference to the specification in conjunction with the drawings.

DETAILED DESCRIPTION OF THE EMBODIMENTS

The invention will now be described in conjunction with a dual damascene copper interconnect process. It will be apparent to those of ordinary skill in the art that the benefits of the invention can be applied to other fabrication processes such as other dual damascene processes.

The invention uses a via protect layer that has specific etch characteristics that avoid the formation of oxide pillars during a dual damascene process. Specifically, the via protect layer has a dry etch rate that is at a minimum equal to that of the intermetal dielectric (IMD) and a vapor HF or wet etch rate that is significantly greater (i.e., ~100x or better) than that of the IMD. The wet etch rate allows the via protect layer to be removed selectively with respect to the IMD. The dry etch rate removes at least as much of the via protect layer as the IMD during the IMD (trench) etch. This ensures that the via protect layer does not extend above the IMD allowing the formation of oxide pillars.

Figure 1A:
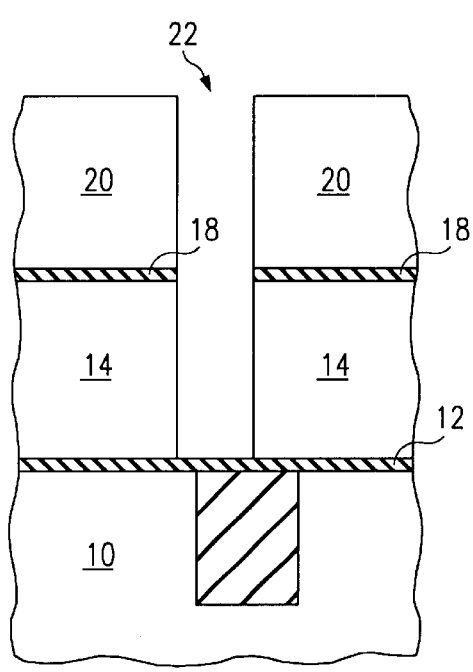
FIGS. 1A–1E are cross-sectional diagrams of a prior art dual damascene process at various stages of fabrication.
Figure 1B:
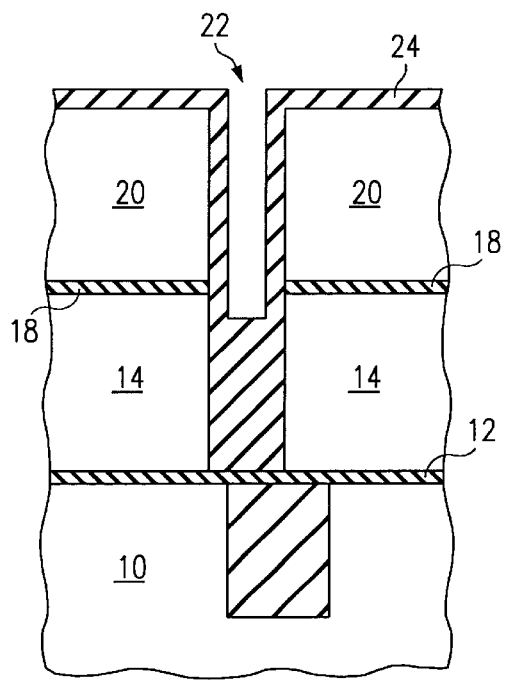
Figure 1C:
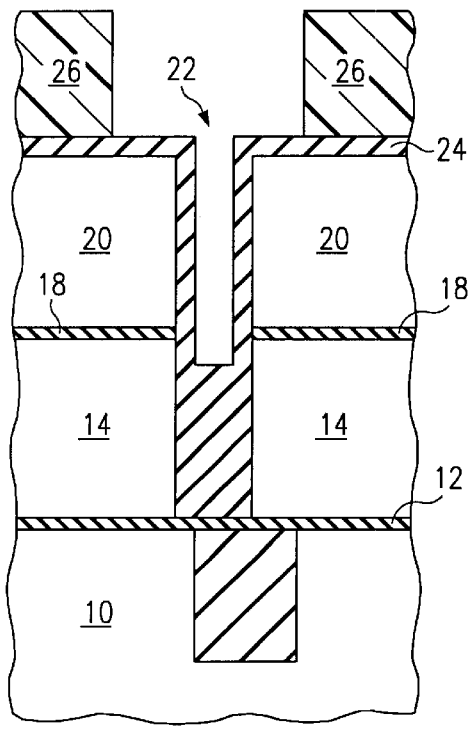
Figure 1D:
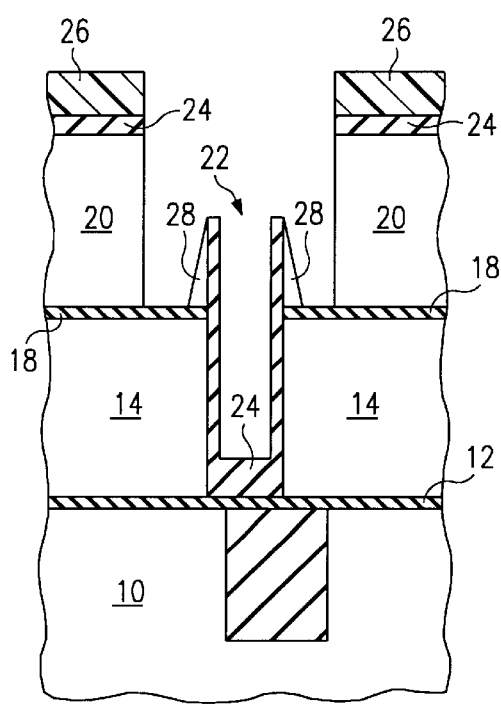
Figure 1E:
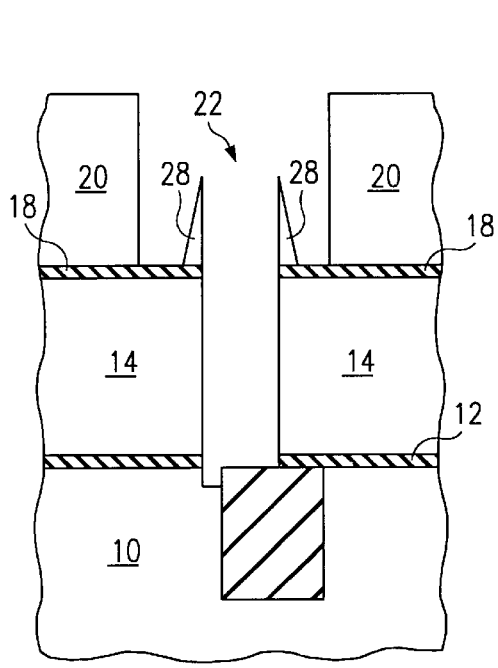
Figure 2A:
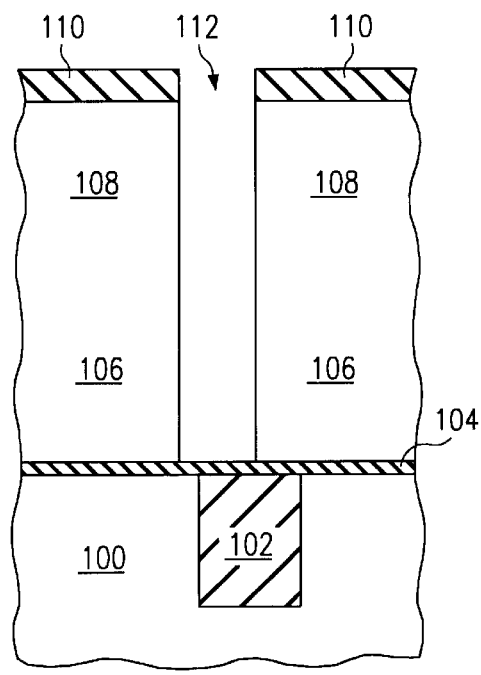
FIGS. 2A–2G are cross-sectional diagrams of a dual damascene process according to the invention as various stages of fabrication.

A fabrication process according to an embodiment of the invention will now be discussed with reference to FIGS. 2A–2G. A semiconductor body 100 is processed through the formation of a first interconnect layer 102 as is known in the art. (Although referred to herein as the first interconnect layer 102, layer 102 may be any interconnect layer except the uppermost interconnect layer.) An etch stop layer 104 is formed over the surface of semiconductor body 100. Etch stop layer 104 typically comprises silicon nitride, but other suitable etch stop layers are known in the art. The via level dielectric 106 (sometimes referred to as interlevel dielectric—ILD) and trench level dielectric 108 (sometimes referred to as intrametal dielectric—IMD) are formed over etch stop layer 104. As shown in FIG. 2A, ILD 106 and IMD 108 can be a single layer. Suitable materials for ILD 106 and IMD 108 are known in the art. The preferred embodiment uses FSG (fluorine-doped silicate glass). Other examples include PETEOS (plasma enhanced tetraethyoxysilane) and lower K dielectrics possibly including Xerogels. An etch stop layer is not necessary between ILD 106 and IMD 108. However, one could be included if desired. Eliminating the etch stop layer between the ILD 106 and IMD 108 has the advantage of reducing parasitic capacitance.

An optional hardmask 110 is formed over IMD 108. Hardmask 110 may, for example, comprise a silicon-oxynitride BARC (bottom anti-reflective coating). This may be the BARC for the subsequent resist pattern described below but deposited before the via pattern and etch. Hardmask 110 protects the corner of the via.

Referring to FIG. 2A, a via 112 is etched through the optional hardmask 110, IMD 108, and ILD 106. The via etch stops on etchstop layer 104. Vias 112 are formed in areas where connection is desired between two metal interconnect layers. If an additional etchstop layer was included between IMD 108 and ILD 106, the via etch also etches through this additional etchstop layer.

Figure 2B:
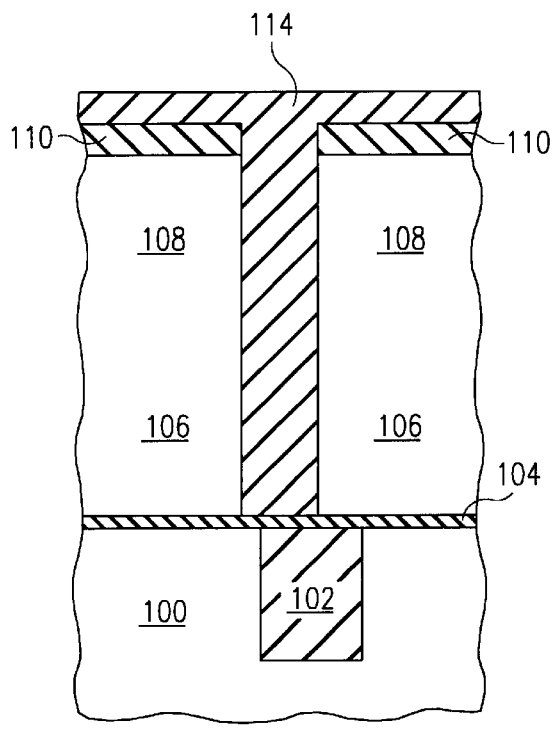
Figure 2C:
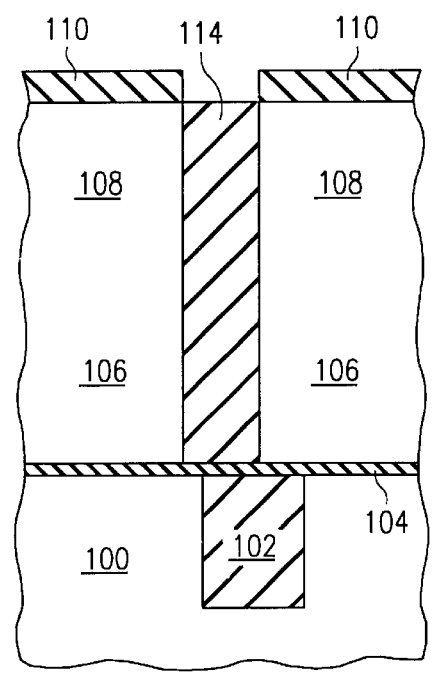

After the via etch, a via protect layer 114 is deposited to fill via 112 as shown in FIG. 2B. After deposition, via protect layer 114 is selectively etched back as shown in FIG. 2C. As described above, via protect layer 114 has specific etch characteristics that avoid the formation of oxide pillars during a dual damascene process. Specifically, the via protect layer 114 has a dry etch rate that is at a minimum equal to that of IMD 108 and a wet etch rate that is significantly greater (i.e., ~100x or better) than that of the IMD 108. The wet etch rate allows the via protect layer 114 to be removed selectively with respect to the IMD 108. The dry etch rate removes at least as much of the via protect layer 114 as the IMD 108 during the IMD (trench) etch. This ensures that the via protect layer 114 does not extend above the IMD 108 allowing the formation of oxide pillars.

Spin-on oxides work especially well as via protect layer 114. The deposition and etchback characteristics allow for consistent filling of via 112. Furthermore, spin-on oxides such as PSG (phosphorous-doped silicate glass), BPSG, (boron and phosphorous-doped silicate glass) and HSQ (hydrogen silsesquioxanes) have excellent etch characteristics. This is especially true when FSG is used for IMD 108. A wet etch selectivity between PSG and FSG of ~100:1 can be easily obtained, while the dry etch rate can be optimized to approximately 1:1.

Figure 2D:
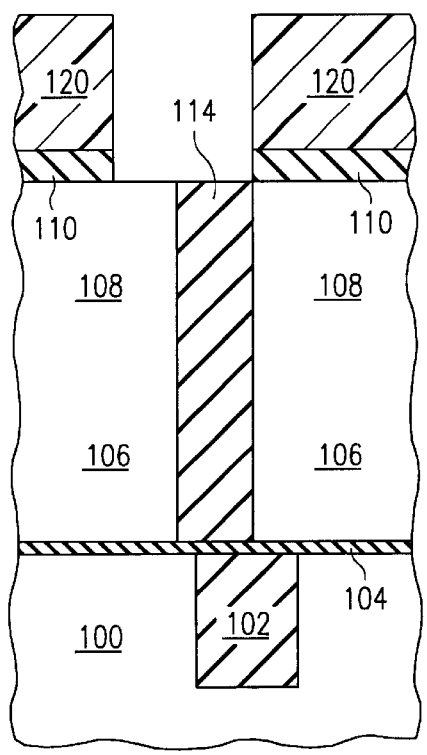

Referring to FIG. 2D, the trench pattern 120 is formed. Trench pattern 120 exposes the area where metal interconnect lines of a second or subsequent metal interconnect layer are desired. If hardmask layer 110 was previously formed, it may be used as the BARC layer for trench pattern 120. The formation of trench pattern 120 includes the step of etching BARC/hardmask layer 110 as shown in FIG. 2D.

Figure 2E:
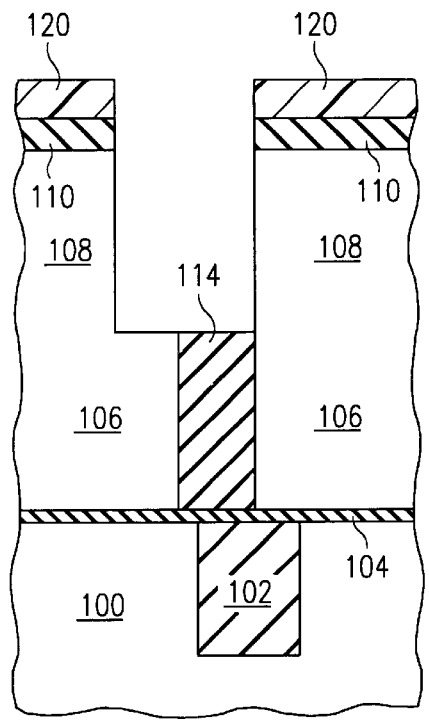

Next, the trench etch is performed to etch IMD 108 as shown in FIG. 2E. In the preferred embodiment, a timed etch is used. If, however, an additional etchstop layer is formed between ILD 106 and IMD 108, a selective etch could be used. It should be noted however, that the incorporation of a silicon-nitride etchstop layer increases the parasitic capacitance between metal interconnect layers.

Figure 2F:
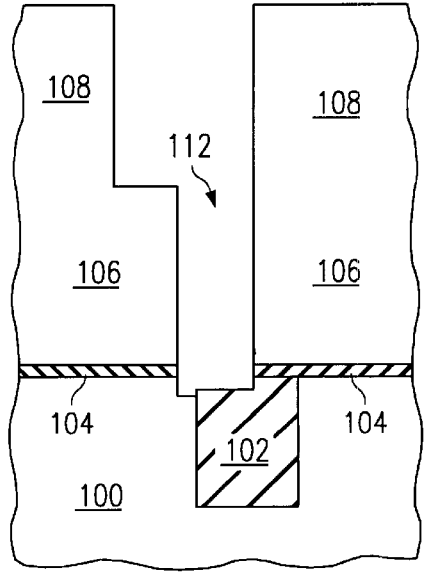

Referring to FIG. 2F, the trench pattern 120 is removed, for example, by ashing. A selective oxide strip is then used to remove the remaining portions of via protect layer 114. The selective oxide strip is a wet etch that has a selectivity between the via protect layer 114 and the IMD 108/ILD 106 of at least 100:1. Because a polymer/resist is not used for the via protect layer 114, the removal of via protect layer 114 leaves a much cleaner via 112. Defect/polymer residue is significantly reduced, thus increasing the process margins. The BARC/hardmask 110 and etchstop layer 104 are also removed.

Figure 2G:
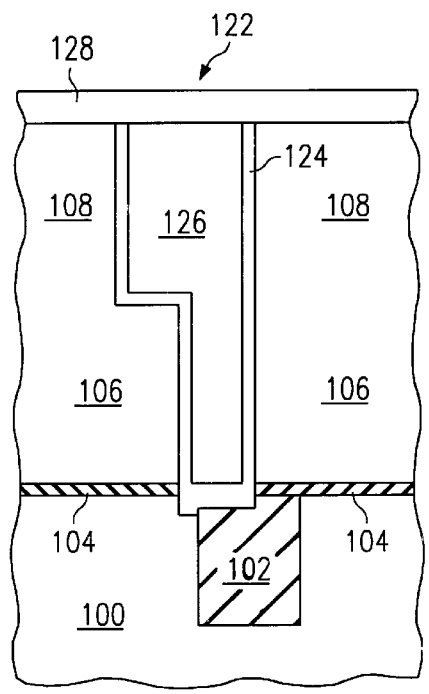

Processing then continues with the formation of the second metal interconnect layer 122, as shown in FIG. 2G. (Although referred to as the second metal interconnect layer, layer 122 can be any metal interconnect layer other than the lowest interconnect layer.) Typically, a barrier layer 124, such as tantalum-nitride (TaN) is deposited first. Due to the fact that no oxide pillars are formed, it is fairly easy to form a continuous barrier layer 124 in the trench/via. This advantage also increases the process margin. A purpose of the barrier layer is to prevent diffusion of the subsequently formed metal into the IMD/ILD. Breaks in the barrier layer allow metal diffusion and thus reduce yield and reliability. The invention thus improves both the yield and reliability by preventing the formation of oxide pillars and reducing defects in the via.

After the barrier layer 124, a copper seed layer is typically formed. This is followed by the formation of the copper interconnect 126 and a top nitride ($Si_3N_4$) capping layer 128. The above process can then be repeated to form subsequent metal interconnect layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an integrated circuit, comprising the steps of:
   forming a dielectric layer over a semiconductor body;
   forming a via in said dielectric layer;
   forming a via protect layer in said via, said via protect layer comprising a material having a wet etch selectivity of approximately 100 or more times that of the dielectric layer and a dry etch selectivity of at least that of the dielectric layer;
   forming a trench pattern over said dielectric layer;
   etching a trench through a portion of said dielectric layer, said etching a trench step removing a portion of said via protect layer;
   selectively removing any remaining portion of said via protect layer; and
   forming a metal layer in said via and said trench.

2. The method of claim 1, wherein said dielectric layer comprises fluorine-doped silicate glass.

3. The method of claim 1, wherein the step of forming a dielectric layer comprises the step of:
   forming a first etchstop layer over said semiconductor body;
   forming an interlevel dielectric layer (ILD) over said first etchstop; and
   forming an intermetal dielectric layer (IMD) over said interlevel dielectric,
   wherein said via extends through said ILD and said trench extends through said IMD.

4. The method of claim 3, further comprising the step of forming a second etchstop layer between said ILD and said IMD.

5. The method of claim 1, further comprising the step of forming a hardmask over said dielectric prior to forming said via.

6. The method of claim 5, wherein said hardmask comprises a bottom antireflective coating.

7. The method of claim 5, wherein said hardmask comprises silicon-oxy-nitride.

8. The method of claim 1, wherein said via protect layer comprises a spin-on oxide.

9. The method of claim 1, wherein said via protect layer comprises a HSQ.

10. A method of forming an integrated circuit, comprising the steps of:

forming a first metal interconnect layer over a semiconductor body;

forming an etchstop layer over said first metal interconnect layer;

forming a dielectric layer over said etchstop layer;

forming a via through said dielectric layer to said etchstop layer;

forming a via protect layer in said via, said via protect layer comprising a material having a wet etch selectivity of approximately 100 or more times that of the dielectric layer and a dry etch selectivity of at least that of the dielectric layer;

forming a trench pattern over said dielectric layer;

dry etching a trench to a first depth in said dielectric layer, said dry etching a trench step removing a portion of said via protect layer to at least said first depth;

selectively removing any remaining portion of said via protect layer using a wet etch having a selectivity of at least 100:1 between said via protect layer and said dielectric layer;

forming a metal layer in said via and said trench.

11. The method of claim 10, wherein the step of forming a dielectric layer comprises the step of:

forming an interlevel dielectric layer (ILD) over said first etchstop; and forming an intermetal dielectric layer (IMD) over said interlevel dielectric.

12. The method of claim 11, further comprising the step of forming a second etchstop layer between said ILD and said IMD.

13. The method of claim 10, further comprising the step of forming a hardmask over said dielectric layer prior to forming said via.

14. The method of claim 13, wherein said hardmask comprises a bottom antireflective coating.

15. The method of claim 13, wherein said hardmask comprises silicon-oxy-nitride.

16. The method of claim 10, wherein said via protect layer comprises a spin-on oxide.

17. The method of claim 10, wherein said via protect layer comprises a HSQ.

* * * * *